US008259767B2

(12) United States Patent
Botez et al.

(10) Patent No.: US 8,259,767 B2
(45) Date of Patent: Sep. 4, 2012

(54) HIGH-POWER QUANTUM CASCADE LASERS WITH ACTIVE-PHOTONIC-CRYSTAL STRUCTURE

(75) Inventors: Dan Botez, Madison, WI (US); Luke J. Mawst, Sun Prairie, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 378 days.

(21) Appl. No.: 12/639,178

(22) Filed: Dec. 16, 2009

(65) Prior Publication Data

US 2012/0201263 A1    Aug. 9, 2012

(51) Int. Cl.
H01S 3/04 (2006.01)
H01S 5/00 (2006.01)
H01L 21/00 (2006.01)
H01L 21/76 (2006.01)

(52) U.S. Cl. ............ 372/43.01; 372/50.12; 372/50.123; 438/46; 438/405

(58) Field of Classification Search ............ 372/29.023, 372/43.01, 50.12, 50.123; 438/46, 405
See application file for complete search history.

(56) References Cited

U.S. PATENT DOCUMENTS

| | | | |
|---|---|---|---|
| 4,860,298 A | 8/1989 | Botez et al. |
| 4,985,897 A | 1/1991 | Botez et al. |
| 5,297,158 A | 3/1994 | Naitou et al. |
| 5,337,074 A | 8/1994 | Thornton |
| 5,386,429 A | 1/1995 | Naito et al. |
| 5,587,334 A | 12/1996 | Naito et al. |
| 7,403,552 B2 | 7/2008 | Botez et al. |
| 7,408,966 B2 | 8/2008 | Botez |
| 7,457,338 B2 | 11/2008 | Mawst et al. |
| 2006/0067375 A1 | 3/2006 | Yamada et al. |
| 2007/0025406 A1 | 2/2007 | Yamada et al. |

FOREIGN PATENT DOCUMENTS

JP    05-167175 A    7/1993

OTHER PUBLICATIONS

International Search Report and Written Opinion received in PCT/US2010/051740, Jun. 16, 2011.
Bai, Y., "Electrically pumped photonic crystal distributed feedback quantum cascade lasers", Applied Physics Letters 91, 144423, 2007.
Li, S., "High Power, single-mode operation from photonic-lattice semiconductor lasers with controllable lateral resonance", Applied Physics Letters 88, 091112, 2006.
Yeh, P., "Optical properties of dual-state Fabry-Perot etalons", Optics Letters vol. 17, No. 24, Dec. 15, 1992.
Kashyap, R., "Surface Plasmon Resonance-Based Fiber and Planar Waveguide Sensors", Journal of Sensors, vol. 2009, Article ID 645162, 9 pages.
Bismuto, A., "Large cavity quantum cascade lasers with InP interstacks", Applied Physics Letters 93, 231104, 2008.

*Primary Examiner* — Armando Rodriguez
(74) *Attorney, Agent, or Firm* — Bell & Manning, LLC

(57) ABSTRACT

Semiconductor laser array devices capable of emitting mid- to long-wavelength infrared (i.e., 4-12 µm) radiation are provided. The devices include a quantum cascade laser (QCL) structure comprising one or more active cores; an optical confinement structure; a cladding structure; and a plurality of laterally-spaced trench regions extending transversely through the optical confinement and cladding structures, and partially into the QCL structure. The trench regions, each of which comprises a lower trench layer comprising a semi-insulating material and an upper trench layer comprising a material having a refractive index that is higher than that of the semi-insulating material, define a plurality of laterally-spaced interelement regions separated by element regions in the laser array device.

18 Claims, 5 Drawing Sheets

US 8,259,767 B2

HIGH-POWER QUANTUM CASCADE LASERS WITH ACTIVE-PHOTONIC-CRYSTAL STRUCTURE

BACKGROUND

Compact laser sources emitting in the mid- to long-wavelength infrared (MWIR to LWIR) range (i.e., 4-12 µm) are currently of great interest for spectroscopic applications such as missile-avoidance systems, laser photo-acoustic spectroscopy (LPAS), homeland security applications, illuminators for range finding in defense applications, medical diagnostics and free-space communications. However the lack of sufficiently powerful, compact sources has so far drastically limited the development in these fields.

SUMMARY

One aspect of the invention provides semiconductor laser array devices comprising a quantum cascade laser structure. The quantum cascade laser structure comprises at least one core, an optical confinement structure comprising at least one layer of optical confinement material above the quantum cascade laser structure and at least one layer of optical confinement material below the quantum cascade laser structure, a cladding structure comprising at least one layer of cladding material above the optical confinement structure and at least one layer of cladding material below the optical confinement structure and a plurality of laterally-spaced trench regions extending transversely, partially into the quantum cascade laser structure. Each trench region comprises a lower trench layer comprising a semi-insulating material and an upper trench layer comprising a material having a refractive index that is higher than that of the semi-insulating material. In addition to the lower and upper trench layers, each trench region can further comprise a layer of thermally conducting material disposed above the upper trench layer. These trench regions define interelement regions separated by element regions in the laser array devices.

The laser array devices are characterized in that the effective refractive index of the fundamental transverse mode supported in the interelement regions is higher than the effective refractive index of the fundamental transverse mode supported in the element regions. In addition, the devices are characterized in that they are designed to produce an in-phase array mode meeting the lateral resonance condition in which there is strong coupling via leaky waves between all of the element regions.

A layer of metal can optionally be disposed over the cladding structure of the devices. In some embodiments of the devices, for the interelement regions the distance between the lower surface of the layer of metal and the uppermost surface of the quantum cascade laser structure is smaller than for the element regions in order to improve heat removal from the quantum cascade laser structure.

Some embodiments of the devices are configured to emit at 8 µm with at least 2.5 Watts of coherent average output power during continuous or quasi-continuous wave operation. In some such embodiments, the devices are configured to provide a wallplug efficiency of at least 15%.

The refractive index step between the effective refractive index of the fundamental transverse mode supported in the interelement regions and the effective refractive index of the fundamental transverse mode supported in the element regions is typically much larger than that of more conventional active photonic crystal laser structures. For example, the refractive index step between the effective refractive index of the fundamental transverse mode supported in the interelement regions and the effective refractive index of the fundamental transverse mode supported in the element regions can be at least 0.05.

Another aspect of the invention provides methods of making a semiconductor laser array device of the type described above. These methods comprise forming a plurality of laterally-spaced trenches in a structure, as described above, growing a lower trench layer in each of the trenches, the lower trench layer comprising a semi-insulating material and growing an upper trench layer in each of the trenches, the upper trench layer comprising a material having a refractive index that is higher than the refractive index of the semi-insulating material, whereby a plurality of element regions separated by interelement regions are defined in the laser array device.

DETAILED DESCRIPTION

Semiconductor laser array devices capable of emitting mid- to long-wavelength infrared (i.e., 4-12 µm) radiation are provided. The devices are capable of operating at high power and high wallplug efficiency during quasi-continuous wave or continuous wave (CW) operation. The devices are suitable for use in a variety of applications, including missile-avoidance systems, laser photo-acoustic spectroscopy, illuminators for targets in military defense range finding, medical diagnostics, free-space communications and laser marking of packaging.

In a basic embodiment, the devices include a quantum cascade laser (QCL) structure comprising one or more active cores; an optical confinement structure; a cladding structure; and a plurality of laterally-spaced trench regions extending transversely through the optical confinement and cladding structures, and partially into the QCL structure. The trench regions, each of which comprises a lower trench layer comprising a semi-insulating material and an upper trench layer comprising a material having a refractive index that is higher than that of the semi-insulating material, define a plurality of laterally-spaced interelement regions separated by element regions in the laser array device. In addition, boundary regions of high refractive index or of high effective refractive index for the fundamental transverse mode are provided adjacent to the element regions at the outer edges of the laser array device. These boundary regions are desirably composed of the same materials as the trench regions.

The optical confinement structure includes one or more layers of optical confinement material above the QCL structure and one or more layers of optical confinement material below the QCL structure. The cladding structure includes one or more layers of cladding material above the optical confinement structure and one or more layers of cladding material below the optical confinement structure.

The laser array devices are configured to support a fundamental transverse mode in the element regions and a fundamental transverse mode in the interelement regions, wherein the effective refractive index of the fundamental transverse mode in the element regions ("the low-index regions") is lower than the effective refractive index of the fundamental transverse mode in the interelement regions ("the high-index regions"). The result is a device having an active photonic crystal (APC) laser structure having an in-phase array mode that meets the lateral resonance condition in which there is strong coupling between all element regions via leaky waves. A description of such a lateral resonance condition for an anti-guided laser array can be found on pages 50-53 of D. Botez, "Monolithic Phase-Locked Semiconductor Laser Arrays." Chapter I of the book "Diode Laser Arrays" by D. Botez and D. R. Scifres eds., Cambridge University Press, July 1994.

Figure 1:
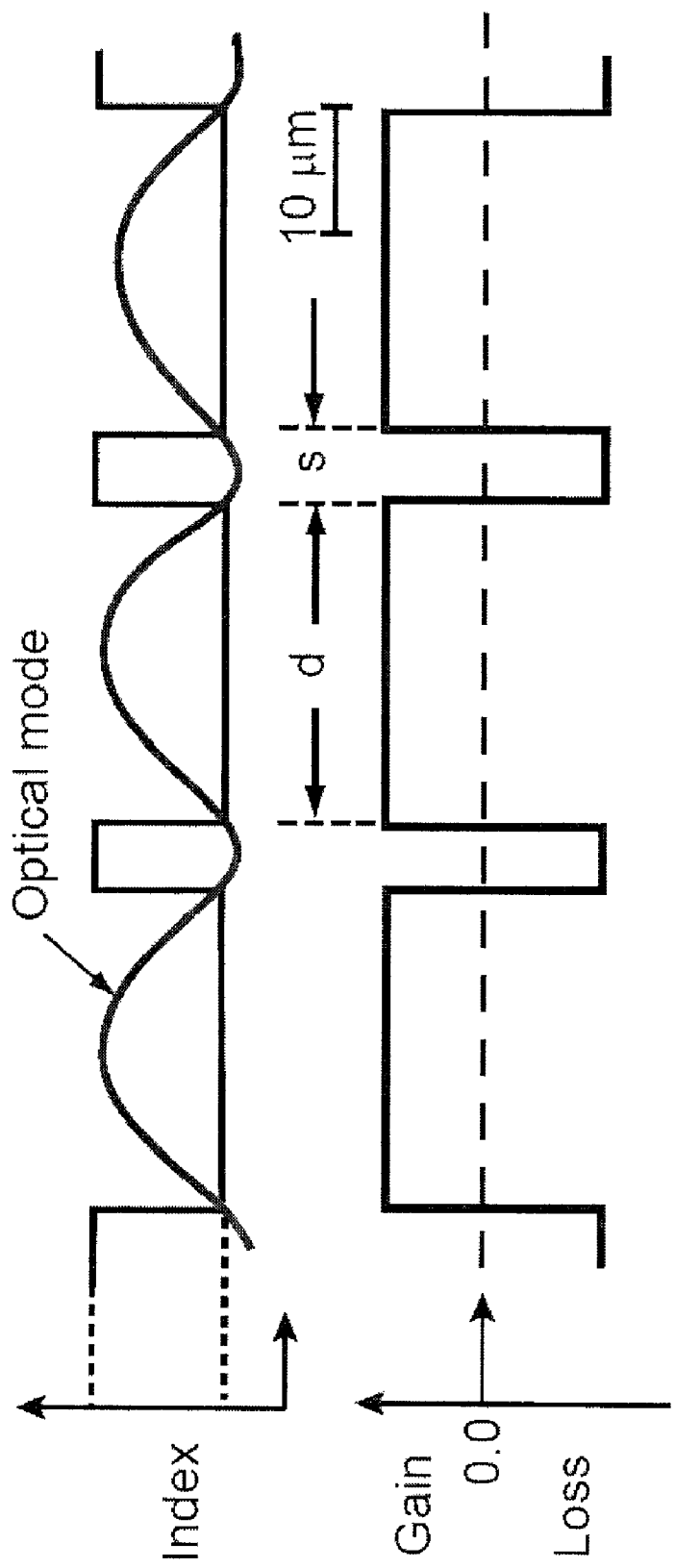
FIG. 1 shows a schematic representation of a laser having an active-photonic-crystal (APC) structure and operating in the in-phase optical mode.

FIG. 1 shows a schematic diagram of an APC laser structure for which the lateral resonance condition for the in-phase mode is met. In the semiconductor laser array device represented by FIG. 1, gain preferentially enhanced on the low-index element regions of the APC can provide single-spatial mode operation to high average powers (e.g., about 2.5-3.0 W) with high (e.g., >15%) wallplug efficiency from a device having only three or four low-index element regions. In this device, the desired in-phase mode is favored to lase since ~99% of its energy lies in the high-gain, low-index element regions, while higher-order modes are discriminated against via optical loss in the high-index interelement regions. Typically, the index step between the effective refractive index of the fundamental transverse mode in the interelement regions and the effective refractive index of the fundamental transverse mode in the element regions is about 0.05 to 0.10. This index step is about an order of magnitude larger than in previous photonic crystal quantum cascade laser structures (see, Bai et al., *Appl. Phys. Lett.*, 88, 091112, (2006)), and thus, unlike for those devices, the beam pattern will not be affected by thermal lensing, and quasi-CW and/or CW operation to watt-range average powers can be achieved in a near diffraction-limited beam.

Figure 2:
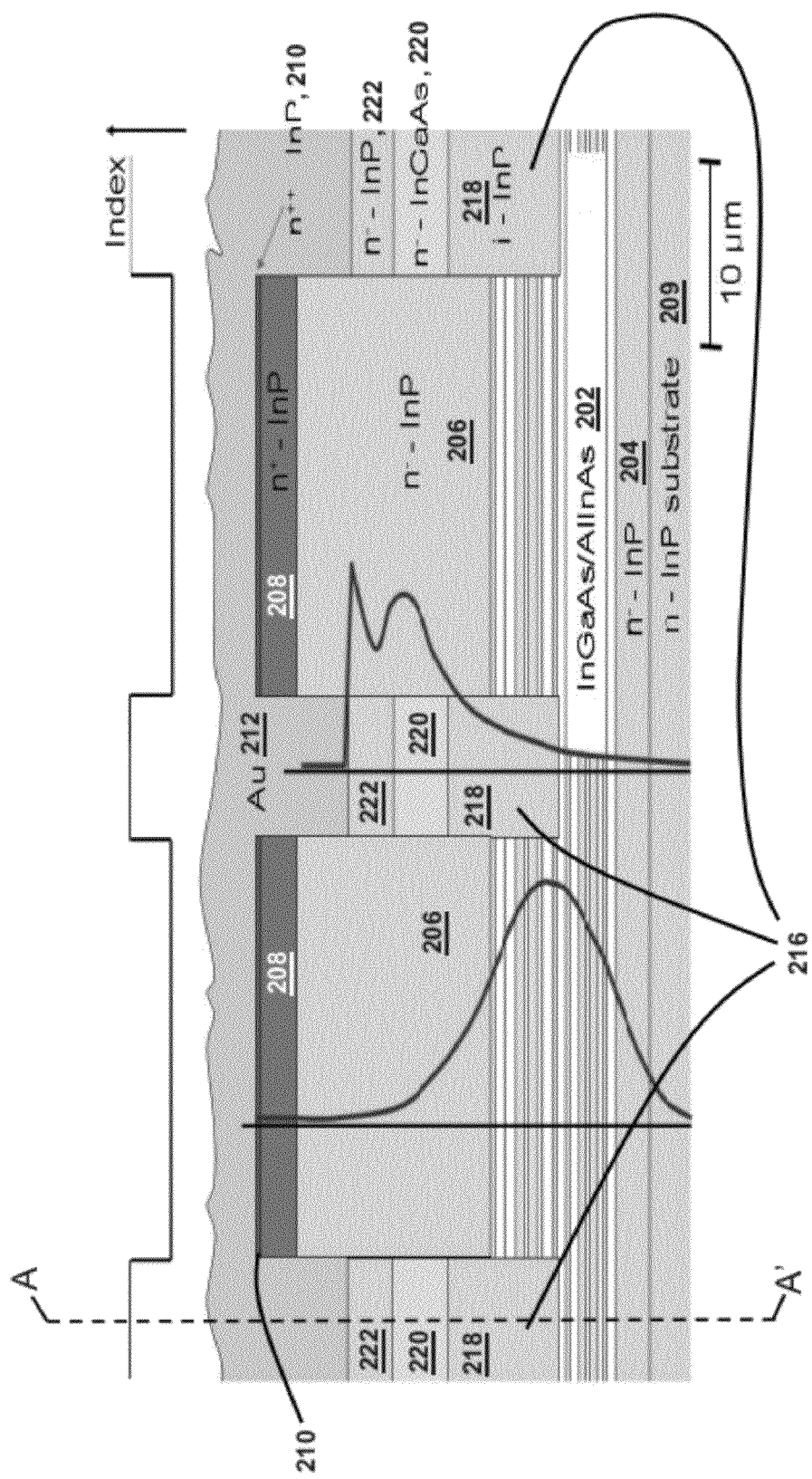
FIG. 2 shows a schematic cross-section of one embodiment of a quantum cascade laser having an APC structure.

One embodiment of a semiconductor laser array device having an APC structure is shown schematically in FIG. 2. For purposes of illustration, the device of FIG. 2 is described in terms of an InP-based system. However, the structure could be based on other semiconductor systems, such as GaAs or GaSb. As shown in the device of FIG. 2, the QCL structure of the device comprises a core 202 composed of a superlattice of quantum wells and barriers. The core provides multiple coupled laser stages (e.g., at least 10, at least 25 or at least 30), each of which includes an electron injector, an active lasing region having at least one quantum well, and an electron reflector. The core desirably includes laser stages having a deep-well structure. In a deep-well structure, the quantum wells in the active lasing region have a well bottom that is lower in energy than the bottoms of the quantum wells in the adjacent electron injector. The use of a deep-well structure is advantageous because it suppresses carrier leakage, rendering the device's performance less sensitive to temperature variations and allowing for more powerful and efficient operation. In some embodiments, the QCL structure can include more than one core. A description of a QCL structure having multiple cores can be found in Bismuto et al., *Appl. Phys. Lett.*, 93, 231104 (2008).

Figure 3:
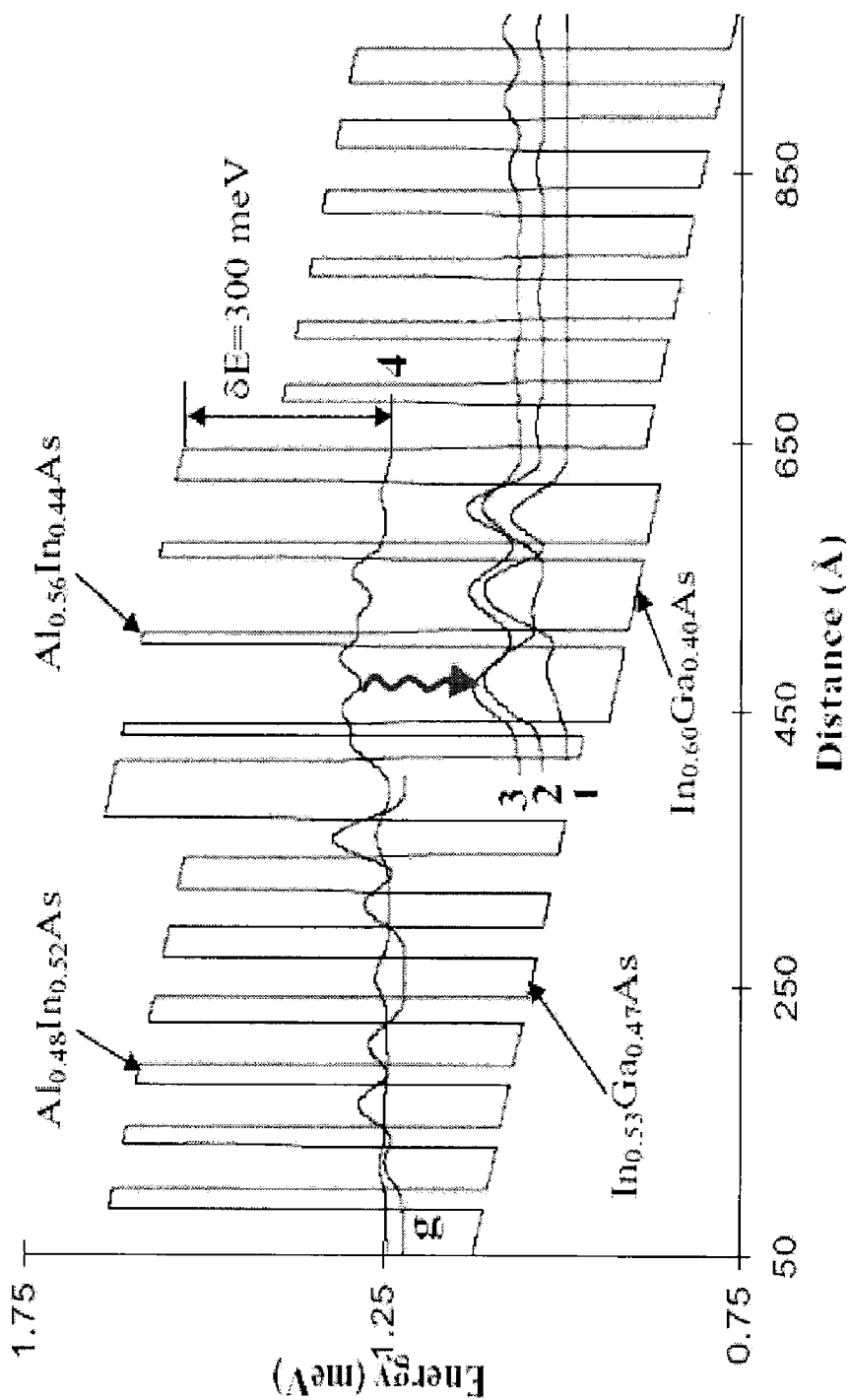
FIG. 3 shows the conduction-band energy diagram for one stage of a quantum cascade laser structure having a deep-well structure. A vertical arrow indicates the lasing transition between energy levels 4 and 3.

FIG. 3 shows the conduction-band energy diagram for one stage in one embodiment of a quantum cascade laser structure having a deep-well structure and designed to emit in the 8-9 μm range. The quantum cascade laser structure of this embodiment is a deep-well structure comprising alternating layers of AlInAs and InGaAs. The structure can be grown by metal-organic chemical vapor deposition (MOCVD) to produce a multilayered structure that includes the various well and barrier layers that make up the core. A more detailed description of deep-well quantum cascade laser structures can be found in U.S. Pat. No. 7,403,552 and No. 7,558,305.

The optical confinement structure of the present devices includes at least one lower layer of optical confinement material and at least one upper layer of optical confinement material. In some embodiments the optical confinement structure can include more than one upper and/or lower layer of optical confinement material. In the device of FIG. 2, the optical confinement structure includes lower and upper optical confinement layers 204, 206 (e.g., n$^-$-InP).

Like the optical confinement structure, the cladding structure can include more than one upper layer and more than one lower layer of cladding material. In the device of FIG. 2, the cladding structure includes upper cladding layer 208 (e.g., n$^+$-InP). A lower cladding layer is provided by a substrate layer 209 (e.g., n-InP) upon which the device is grown. In addition, the cladding structure depicted in FIG. 2 includes an additional upper cladding layer 210 (e.g., n$^{++}$-InP). The optical confinement layers are selected to provide appropriate electrical conduction across them and to have an appropriate index of refraction so as to cooperate with the cladding layers to provide optical confinement of the emitted light to the QCL structure. The additional cladding layer 210 can be employed to suppress absorption losses to a layer of metal 212 (e.g., Au) deposited on the structure.

Figure 4:
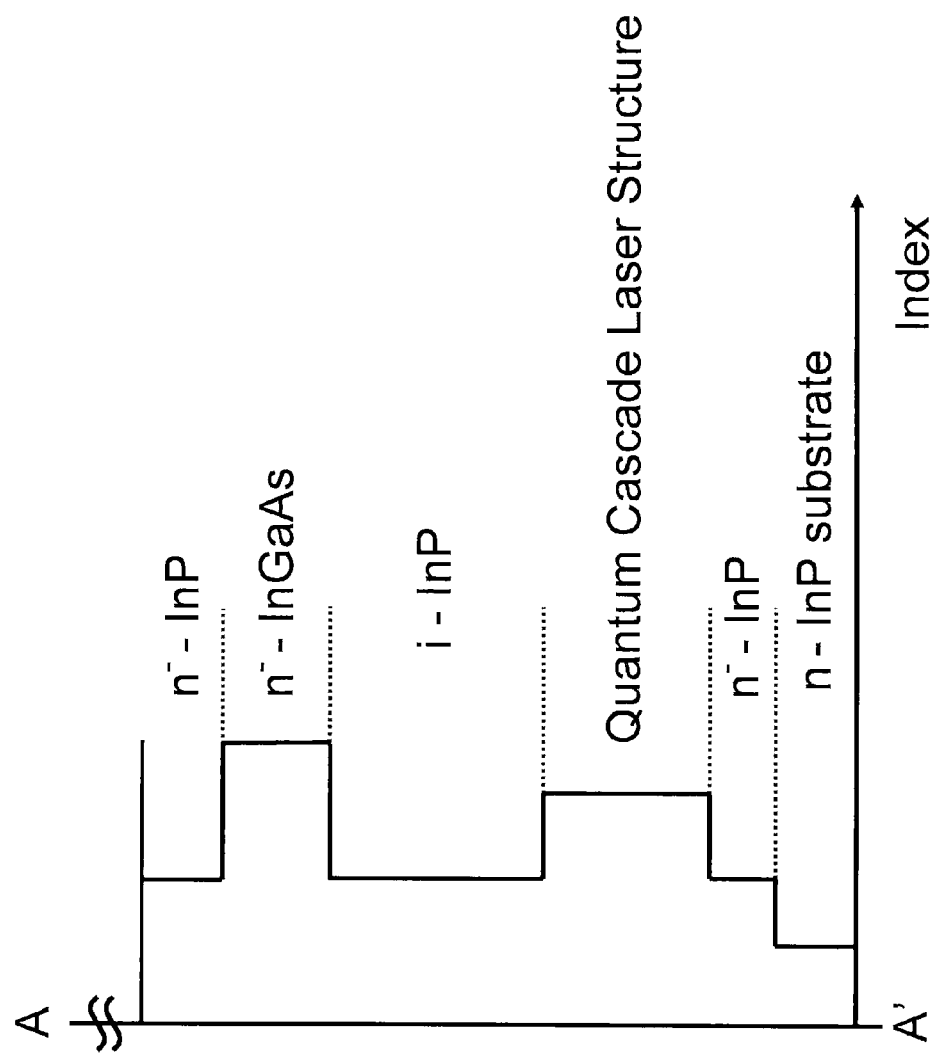
FIG. 4 shows the transverse refractive index profile for the interelement region of the device in FIG. 2.

The interelement regions of the laser array device correspond to a plurality of trench regions, which are filled trenches 216 extending through the upper sections of the optical confinement and cladding structures and partially into the QCL structure 202. Each of the filled trenches includes a lower trench layer 218 adjacent to the QCL structures in the neighboring element regions, the lower trench layer comprising a semi-insulating material (e.g., Fe-doped InP or semi-insulating InP) to prevent current leakage through the low voltage portion of the QCL structure into which the filled trench extends. The filled trenches may extend a considerable distance into the QCL structure. For example, in some embodiments the filled trenches extend through at least 25% of the stages in the QCL structure. This includes embodiments in which the filled trenches extend through at least 50% of the stages in the quantum cascade laser structure. Each of the filled trenches further includes an upper trench layer 220 comprising a material having a higher index of refraction than the semi-insulating material. For example, in the embodiment shown in FIG. 2, the upper trench layer can be composed of n$^-$-InGaAs. Each of the filled trenches may further optionally include an additional trench layer 222 above the upper trench layer comprising a highly thermally conductive material (e.g., n$^-$-InP), and can still further include a layer of metal 212 (e.g., a ~5 μm layer of electroplated Au) over the additional trench layer 222. FIG. 4 shows a schematic representation of the transverse refractive index profile through an interelement region (excluding the metal layer) taken at line A-A' of FIG. 2.

The filled trench design depicted in FIG. 2 facilitates lateral heat removal from the element regions of the device, due to the presence of high thermal conductivity materials (i.e., InP) and the close proximity of the metal layer to the QCL structure. In addition, this filled trench design provides for intermodal discrimination for selecting lasing only in the in-phase mode, as described in greater detail in the Example, below.

The present semiconductor laser array devices can be made by growing the QCL structure on a substrate using metal-organic chemical vapor deposition (MOCVD). The QCL structure can then be patterned to fabricate trenches by using a combination of reactive ion-etching and wet-chemical etching, and preferential MOCVD regrowth can be utilized to form the high-index interelement regions of the APC structure. For the embodiment shown in FIG. 2, using $Si_3N_4$ stripe masks, the InP, InGaAs and InGaAs/AlInAs material layers can be removed by dry etching. For example, using Electron Cyclotron Resonance (ECR) etching with a $CH_4/H_2/Ar/Cl_2/BCl_3$ gas mixture. A final wet chemical etch may be desirable to remove the reactants of B and Ga, to insure nearly perfect smoothness of the sidewalls. Using a dielectric mask, selective MOCVD regrowth of the various trench layers that define the high-index interelement regions of the APC can be performed.

As explained in greater detail in the Example below, the present semiconductor laser array devices can operate at high power and high wallplug efficiencies during CW or quasi-CW operation. For example, some embodiments of the present devices provide an 8 μm-emitting laser with a diffraction-limited beam having an average output power of at least 2.5 W with a wallplug efficiency of at least 15% under quasi-CW operation at 20% duty cycle. This includes devices that provide 8 μm-wavelength lasing with a diffraction-limited beam having an average output power of at least 3 W with a wallplug efficiency of at least 20% under quasi-CW operation at 20% duty cycle.

EXAMPLE

The calculations provided in this example illustrate the ability of the filled trench design in the present semiconductor laser array devices to select lasing in the in-phase mode only, and further illustrate the ability of at least certain embodiments of the devices to achieve high coherent average output powers and high wallplug efficiencies during quasi-CW (i.e., at 20% duty cycle) operation at 8 μm wavelength.

The filled trench design in the interelement regions draws the field away from the QCL structure, thereby achieving two desired characteristics at once: high-effective-index and low modal gain, due both to significantly reduced transverse field overlap with the QCL structure, as well as to strong absorption loss to the metal deposited above the cladding structure. The metal in the design of FIG. 2 is brought closer to the uppermost layers of the QCL structure, in order to insure strong absorption in those regions. For the design shown in FIG. 2, the loss coefficient in the high-index interelement regions is 98 $cm^{-1}$, while in the low-index element regions it is only 7 $cm^{-1}$. Preferential lasing of the desired in-phase mode (FIG. 1) occurs at and near its lateral resonance. For $\lambda$=8.0 μm and a (lateral) index step of 0.07, the lateral resonance is calculated to occur for s=6.0 μm, where s is the width of the high-index interelement regions (FIG. 1). At and near its resonance the in-phase mode has ~99% of its field in those regions while non-resonant modes have as little as 86% of their field in those regions. In turn, only ~1% of the in-phase mode "sees" the losses in the high-index interelement regions while the non-resonant leaky modes "see" significantly more loss.

Figure 5:
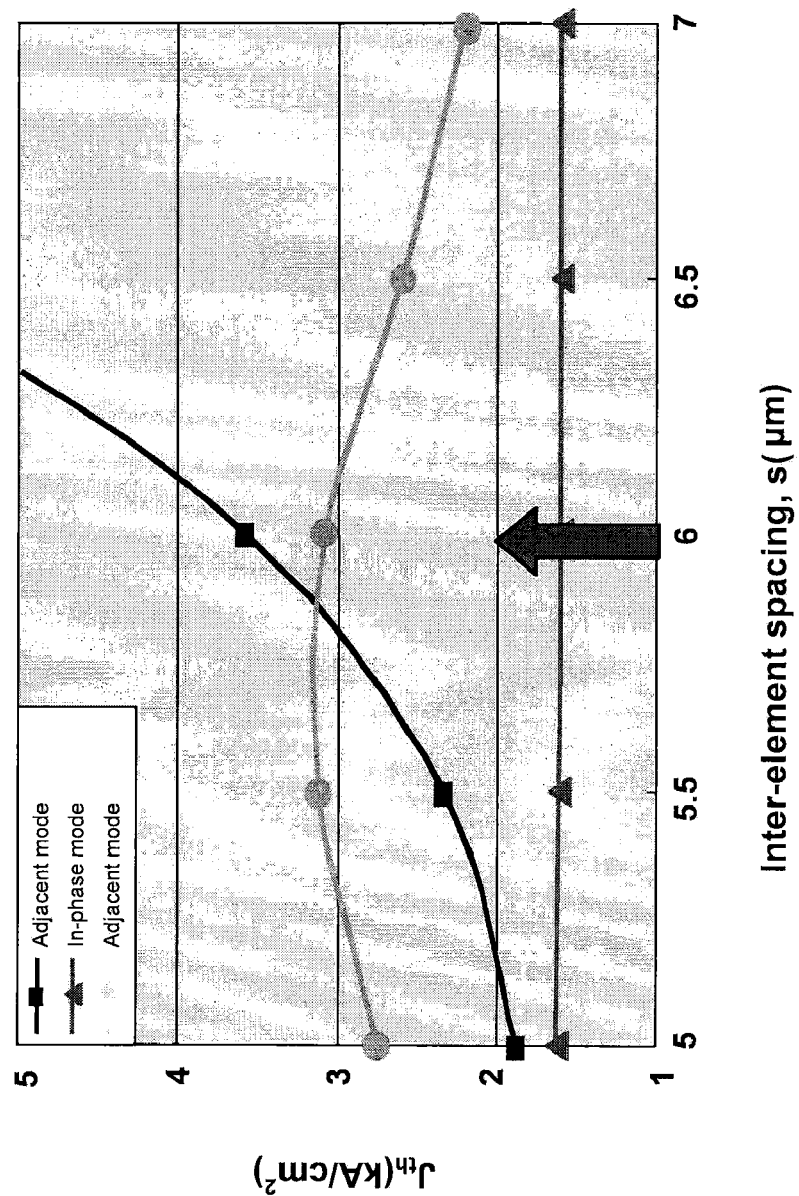
FIG. 5 shows threshold-current densities for the in-phase, upper-adjacent and lower-adjacent modes of a quantum cascade laser having an APC structure with three interelement regions as a function of the interelement spacing. The arrow indicates the lateral resonance for the in-phase mode.

At resonance, to get a significant amount of energy (i.e., ~67%) in the central far-field lobe, the low-index element region width, d, is desirably about 5 times larger than s. For purposes of illustration, using a d value of 30 μm, a one-dimensional analysis for the structure shown in FIG. 2 containing three low-index element regions can be performed. FIG. 5 shows the calculated threshold-current density, $J_{th}$, for the desired in-phase mode and the high-order modes adjacent to it, for a 3 mm-long device with a high-reflectivity (HR) coating on its back facet. For the $J_{th}$ values the following standard formula can be used:

$$J_{th,m} = \frac{\alpha_{end} + \alpha_{w,m}}{g\Gamma_{2D,m}} \quad (1)$$

where $\alpha_{end}$ is the mirror loss, $\alpha_{w,m}$ is the waveguide loss for the $m^{th}$ mode, g is the gain coefficient (~10 cm/kA for 8 μm QCLs) and $\Gamma_{2D,m}$ is the two-dimensional confinement factor for the $m^{th}$ mode. The mode discriminators are the $\alpha_{w,m}$ and the $\Gamma_{2D,m}$ terms as they vary significantly near the in-phase mode resonance. As seen from FIG. 5, at and near its resonance the in-phase mode is strongly favored to lase because it has both the highest $\Gamma_{2D}$ value and the lowest $\alpha_{w,m}$ value; since, as mentioned above, it "sees" the least amount of loss in the high-index sites. (The APC modes composed of coupled first-order modes (in each low-index site) are also suppressed since their $\Gamma_{2D}$ values are smaller that the $\Gamma_{2D}$ value of the in-phase-mode at and near its resonance.) In-phase mode lasing is favored over an ~2.0 μm-wide region in s variation. For beamwidths≦2 times the diffraction limit (i.e., a mixture of the in-phase mode and an adjacent mode) s can vary over a region as wide as 3.0 μm. Thus, for both cases the fabrication tolerances are easily achievable via photolithography.

For purposes of illustration, the parameters used to obtain ~3 W of coherent average output power can also be determined. The estimated average power from a 10 μm-wide aperture device utilizing a deep-well quantum cascade laser structure in the core is 0.5 W. A 4-element region structure with 30 μm-wide low-index element regions corresponds to 6.0 W. Assuming ~7% power penalty due to APC-related losses and that 67% of the total power is emitted in the main far-field lobe, the projected available diffraction-limited average power is ~3.6 W. Taking into account the ~7% power penalty and that only the main-lobe power is collected, the projected maximum wallplug efficiency at 20% duty cycle for this embodiment is 15.6% at an average output power of 2.5 W.

However, as long as the emitted power is spatially coherent and of flat phase front one can use the method of amplitude-to-phase conversion to garner all light in the central lobe. Thus, in one embodiment, 95% of the power can be garnered in the central lobe and the necessary optics may cause a 10% drop in output. Then the useful power becomes 3.2 W delivered with a wallplug efficiency of 20%.

As used herein, and unless otherwise specified, "a" or "an" means "one or more." All patents, applications, references, and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A semiconductor laser array device-comprising:
   (a) a quantum cascade laser structure comprising a core;
   (b) an optical confinement structure comprising at least one layer of optical confinement material above the quantum cascade laser structure and at least one layer of optical confinement material below the quantum cascade laser structure;
   (c) a cladding structure comprising at least one layer of cladding material above the optical confinement structure and at least one layer of cladding material below the optical confinement structure; and
   (d) a plurality of laterally-spaced trench regions extending transversely, partially into the quantum cascade laser structure; wherein each trench region comprises a lower trench layer comprising a semi-insulating material and an upper trench layer comprising a material having a refractive index that is higher than the refractive index of the semi-insulating material; and further wherein the trench regions define interelement regions separated by element regions in the laser array device;
   the laser array device characterized in that the effective refractive index of the fundamental transverse mode supported in the interelement regions is higher than the effective refractive index of the fundamental transverse mode supported in the element regions, and further characterized in that the laser array device is designed to produce an in-phase array mode meeting the lateral resonance condition in which there is strong coupling via leaky waves between all of the element regions.

2. The device of claim 1, wherein each trench region further comprises a layer of thermally conducting material disposed above the upper trench layer.

3. The device of claim 2, further comprising a layer of metal disposed over the cladding structure.

4. The device of claim 3, wherein the distance between the lower surface of the layer of metal and the uppermost surface of the quantum cascade laser structure is smaller for the interelement regions than for the element regions.

5. The device of claim 1, wherein the device is configured to emit at 8 µm with at least 2.5 Watts of coherent average output power during continuous or quasi-continuous wave operation.

6. The device of claim 5, wherein the device is configured to provide a wallplug efficiency of at least 15%.

7. The device of claim 1, wherein the refractive index step between the effective refractive index of the fundamental transverse mode supported in the interelement regions and the effective refractive index of the fundamental transverse mode supported in the element regions is at least 0.05.

8. The device of claim 1, wherein the width of the element regions is about 5 times the width of the interelement regions.

9. The device of claim 1, wherein the trench regions extend through at least 25% of the quantum cascade laser structure thickness.

10. The device of claim 1, further comprising boundary regions adjacent to the element regions at the outer edges of the laser array, the boundary regions comprising the same materials as the trench regions.

11. The device of claim 1, wherein the core comprises multiple coupled laser stages each of which includes an electron injector, an active lasing region having at least one quantum well, and an electron reflector.

12. The device of claim 11, wherein the active lasing regions have a deep-well structure.

13. The device of claim 2, wherein the core comprises multiple coupled laser stages each of which includes an electron injector, an active lasing region having at least one quantum well, and an electron reflector, the quantum cascade laser structure comprising alternating AlInAs barrier layers and InGaAs well layers.

14. The device of claim 13, wherein the active lasing regions have a deep-well structure.

15. The device of claim 13, wherein the lower trench layer comprises InP, the upper trench layer comprises $n^-$-InGaAs and the thermally conducting material comprises $n^-$-InP.

16. A method of making a semiconductor laser array device, the method comprising:
   (a) forming a plurality of laterally-spaced trenches in a structure comprising:
      (i) a quantum cascade laser structure comprising a core;
      (ii) an optical confinement structure comprising at least one layer of optical confinement material above the quantum cascade laser structure and at least one layer of optical confinement material below the quantum cascade laser structure; and
      (iii) a cladding structure comprising at least one layer of cladding material above the optical confinement structure and at least one layer of cladding material below the optical confinement structure; wherein the trenches extend transversely into the structure and partially through the quantum cascade laser structure; and
   (b) growing a lower trench layer in each of the trenches, the lower trench layer comprising a semi-insulating material; and
   (c) growing an upper trench layer in each of the trenches, the upper trench layer comprising a material having a refractive index that is higher than the refractive index of the semi-insulating material;
   whereby a plurality of element regions separated by interelement regions are defined in the laser array device;
   the laser array device characterized in that the effective refractive index of the fundamental transverse mode supported in the interelement regions is higher than the effective refractive index of the fundamental transverse mode supported in the element regions, and further characterized in that the laser array device is designed to produce an in-phase array mode meeting the lateral resonance condition in which there is strong coupling via leaky waves between all of the element regions.

17. The method of claim 16, further comprising growing a layer of thermally conducting material above each upper trench layer.

18. The method of claim 17, further comprising depositing a layer of metal over the cladding structure.

* * * * *